US 6,563,687 B2

(12) United States Patent
Kawazoe et al.

(10) Patent No.: US 6,563,687 B2
(45) Date of Patent: May 13, 2003

(54) PIEZOELECTRIC DEVICE FOR INJECTOR, METHOD FOR PRODUCING THE SAME, AND INJECTOR

(75) Inventors: Naoyuki Kawazoe, Hashima (JP); Satoshi Hayashi, Kuwana (JP)

(73) Assignee: Denso Corporation (JP)

( * ) Notice: Subject to any disclaimer, the term of this patent is extended or adjusted under 35 U.S.C. 154(b) by 0 days.

(21) Appl. No.: 10/013,872

(22) Filed: Dec. 13, 2001

(65) Prior Publication Data
US 2002/0084350 A1 Jul. 4, 2002

(30) Foreign Application Priority Data

Dec. 28, 2000 (JP) ......................... 2000-400205
Oct. 5, 2001 (JP) ......................... 2001-309986

(51) Int. Cl.[7] .............................. H01G 4/30
(52) U.S. Cl. ................. 361/301.4; 361/760; 361/321; 361/306; 361/307
(58) Field of Search .................. 361/301.4, 760, 361/748, 756, 762, 767, 784, 102, 128, 321, 306, 307

(56) References Cited

U.S. PATENT DOCUMENTS

| | | | | | |
|---|---|---|---|---|---|
| 3,963,966 A | * | 6/1976 | Mohr | ......................... | 317/81 |
| 5,233,260 A | * | 8/1993 | Harada et al. | .............. | 310/328 |
| 5,250,868 A | * | 10/1993 | Shirasu | ....................... | 310/328 |
| 5,321,761 A | * | 6/1994 | Kitanishi | .................... | 381/190 |
| 5,325,012 A | * | 6/1994 | Sato et al. | .................. | 310/364 |
| 5,345,136 A | * | 9/1994 | Takagi et al. | ............... | 310/320 |
| 6,215,230 B1 | * | 4/2001 | Ide et al. | .................... | 310/366 |
| 6,345,606 B1 | * | 2/2002 | Ricci-Ottati et al. | ........ | 123/456 |

FOREIGN PATENT DOCUMENTS

| | | |
|---|---|---|
| JP | A-63-260087 | 10/1988 |
| JP | A-7-321383 | 12/1995 |
| JP | A-7-335952 | 12/1995 |

* cited by examiner

*Primary Examiner*—Anthony Dinkins
*Assistant Examiner*—Nguyen Ha
(74) *Attorney, Agent, or Firm*—Nixon & Vanderhye P.C.

(57) ABSTRACT

A stacked-type piezoelectric device 1 to be built in an injector includes a metal case 41 outside its side surfaces. An insulating member 45 having an electric insulation property is interposed between the side surfaces 101, 102 of the piezoelectric device 1 and an inner surface 410 of the case 41. The insulating member 45 is bonded to either the side surfaces 101, 102 of the piezoelectric device 1 or the inner surface 410 of the case, and at least a part of the insulating member 45 is in contact with the other surface.

13 Claims, 10 Drawing Sheets

PIEZOELECTRIC DEVICE FOR INJECTOR, METHOD FOR PRODUCING THE SAME, AND INJECTOR

BACKGROUND OF THE INVENTION

1. Field of the Invention

This invention relates to a piezoelectric device used as a driving source of an injector.

2. Description of the Related Art

An injector (fuel injection device) of an internal combustion engine, or the like, of an automobile is constituted in such a fashion that an opening/closing state of a fuel passage is changed over when a three-way valve or two-way valve connected to a common rail storing a high-pressure fuel is operated, to thereby change a pressure condition applied to a nozzle needle, and the fuel is injected when the nozzle needle is opened.

A solenoid valve is generally used as a driving source for operating the valve body. In contrast, attempts have been made to use a stacked-type piezoelectric device as the driving source so as to precisely control the fuel injection state by controlling more precisely the driving source.

However, an injector using the piezoelectric device for the driving source has not yet been put into practical application.

Japanese Unexamined Patent Publication (Kokai) No. 7-321383, for example, discloses a conventional piezoelectric device that has a coating film of an insulating resin on outer peripheral side surfaces of a stacked-type piezoelectric device. This film is directed to improve moisture resistance and to protect the piezoelectric device from an impact.

On the other hand, a piezoelectric device for an injector must have extremely high-speed response to open and close a valve at a high speed. In the piezoelectric device for an injector, therefore, charging and discharging is repeated within a very short time, and a large current flows. For this reason, if the coating film of the insulating resin is merely formed on the outer peripheral side surfaces of the piezoelectric device as in the prior art device, the coating film prevents the radiation of the heat generated by the energy consumed inside the piezoelectric device. As heat stays inside the piezoelectric device and the temperature rises, a drop in performance of the piezoelectric device may occur and, in the worst case, the piezoelectric device may be broken.

When the rise of the internal temperature of the piezoelectric device is large, the necessary energy becomes large, too, and this imparts a burden on a control circuit with the result that the size of the control circuit must be increased.

SUMMARY OF THE INVENTION

In view of the problems of the prior art described above, it is therefore an object of the present invention to provide a piezoelectric device for an injector having less internal exothermy and a smaller consumed energy.

According to one aspect of the present invention, there is provided a stacked-type piezoelectric device, for an injector, to be built into the injector, including a metal case outside the side surfaces of the piezoelectric device, wherein an insulating member having an electric insulating property is interposed between the side surfaces of the piezoelectric device and an inner surface of the case, one surface of this insulating member is bonded to either the side surfaces of the piezoelectric device or the inner surface of the case, and at least a part of the other surface of the insulating member is in contact with the side surfaces or the inner surface.

In the piezoelectric device according to the present invention, the insulating member is bonded to the side surfaces of the piezoelectric device or is in contact with the side surfaces. Therefore, heat occurring inside the piezoelectric device is directly transferred to the insulating member without passing through an air layer.

The insulating member is in contact with the metal case or is bonded to the metal case. Therefore, heat transferred to the insulating member is directly transferred to the case without passing through an air layer.

Here, since the case is made of a metal, efficient heat radiation, by utilizing high thermal conductivity, can be accomplished. Therefore, the heat transfer from the piezoelectric device to the insulating member is promoted and a temperature rise of the piezoelectric device can be suppressed.

In the present invention, in particular, either the boundary surface of the insulating member with the piezoelectric device or the boundary surface of the insulating member with the case is in a bonded state, and the other surface is merely in contact. Therefore, in comparison with the construction where these two boundary surfaces are bonded, deformation of the case due to thermal expansion of the insulating member can be suppressed. In other words, since one of the boundary surfaces is merely in contact, the two members can move while maintaining mutual heat transferability. Therefore, when the insulating member undergoes thermal expansion, its movement at the contact surface can escape stress, that would otherwise invite deformation of the case, to a certain extent, and deformation of the case can thus be suppressed.

As described above, the present invention can provide a piezoelectric device for an injector which consumes less energy due to a restriction on the internal temperature, or the like.

According to another aspect of the present invention, there is provided a stacked-type piezoelectric device to be built in an injector, wherein side surface electrodes are disposed on the side surfaces of the piezoelectric device, respectively, an external electrode for establishing electric conduction with outside is provided to each side surface electrode, and thermal conductivity of the external electrode is at least 15 W/m·K.

As described above, the piezoelectric device for the injector according to the present invention has an external electrode the thermal conductivity of which is limited to the specific value described above. Therefore, a rise of the internal temperature of the piezoelectric device can be suppressed. On the other hand, when the thermal conductivity of the external electrode is less than 15 W/m·K, the heat radiation effect of the external electrode cannot be sufficiently obtained.

According to still another aspect of the present invention, there is provided a piezoelectric device for an injector having a built-in piezoelectric device as a driving source, wherein the piezoelectric device has a metal case outside side surface thereof, an insulating member having an electric insulation property is disposed between the surfaces of the piezoelectric device and an inner surface of the case, one surface of the insulating member is bonded to either the side surfaces of the piezoelectric device or the inner surface of the case, and at least a part of the other surface of the insulating member is in contact with the other surface, and wherein the case is so constituted as to directly or indirectly come into contact with a cooling fluid inside the injector.

In the injector according to the present invention, the cooling fluid can directly or indirectly cool the metal case, and the heat from the piezoelectric device can be efficiently radiated. Therefore, a high-speed response of the piezoelectric device can be secured and a control circuit can be rendered compact. Accordingly, the injector of the present invention is compact and has an excellent performance.

According to still another aspect of the present invention, there is provided a method of producing a stacked-type piezoelectric device to be built in an injector, comprising the steps of covering the outside of side surfaces of the piezoelectric device with an insulating member, and bonding the insulating member and the side surfaces of the piezoelectric device; and inserting the piezoelectric device covered with the insulating member into a metal case.

In the production method according to the present invention, the insulating member is disposed in advance on the piezoelectric device, and the piezoelectric device is then disposed inside the case. In this way, bonding adhesion between the insulating member and the piezoelectric device and the contact state between the insulating member and the case can be achieved easily in a relatively narrow space between the piezoelectric device and the case, and the occurrence of defects such as voids can be suppressed when the insulating member is disposed.

In consequence, an excellent piezoelectric device for the injector described above can be produced.

According to still another aspect of the present invention, there is provided a method of producing a stacked-type piezoelectric device to be built in an injector, comprising the steps of covering an inner surface of a metal case with an insulating member, and bonding the insulating member to the inner surface of the case; and inserting the piezoelectric device into the case covered with the insulating member.

This production method can also provide the same function and effect as that of the production method described above. In other words, according to this production method, the insulating member is disposed in advance on the inner surface of the case, and the piezoelectric device is then disposed inside the case. In this way, bonding adhesion between the insulating member and the case and the contact state between the insulating member and the piezoelectric device can be easily achieved inside a relatively narrow space between the piezoelectric device and the case, and the occurrence of defects such as voids can be suppressed when the insulating member is disposed. In consequence, this production method, too, can produce an excellent piezoelectric device for the injector.

The present invention may be more fully understood from the description of preferred embodiments of the invention as set forth below, together with the accompanying drawings.

DESCRIPTION OF THE PREFERRED EMBODIMENTS

First Embodiment

A piezoelectric device for an injector according to an embodiment of the present invention will be explained with reference to FIGS. 1 to 4.

Figure 1:
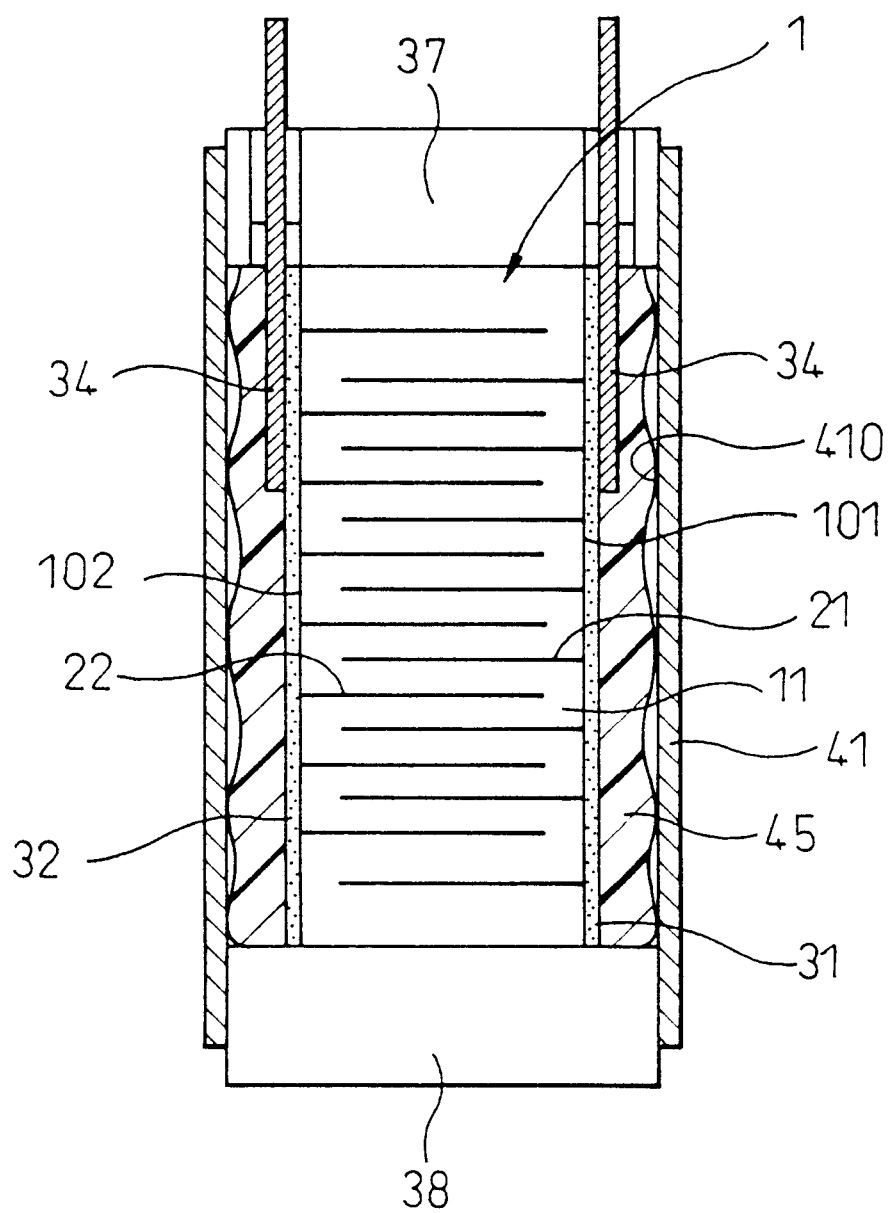
FIG. 1 is an explanatory sectional view showing a construction of a piezoelectric device according to a first embodiment of the present invention.

The piezoelectric device 1 according to this embodiment is a stacked-type piezoelectric device that is built in an injector as shown in FIG. 1.

The piezoelectric device 1 has a metal case 41 outside its side surfaces 101 and 102 for covering the side surfaces.

An insulating member 45 having an electric insulation property is arranged between the side surfaces 101 and 102 of the piezoelectric device 1 and the inner surface of the case 41. The insulating member 45 is bonded to the side surfaces 101 and 102 of the piezoelectric device 1, and at least part is in contact with the inner surface 410 of the case 41.

In this case, on the surface where the insulating member 45 and the piezoelectric device 1 are bonded, the insulating member 45 is preferably bonded to the piezoelectric device 1 over at least 90% of their boundary area, and on the other surface where the insulating member 45 and the case 41 keep contact, the insulating member 45 preferably is in contact with the case 41 over not more than 30% of their boundary area. This arrangement can improve the heat radiation property and a deformation restriction effect of the case when the insulating member undergoes thermal expansion. When the bonded area is less than 90% of the boundary area on the bonded surface, a drop in the heat radiation property will occur, and when the contact area exceeds 30% of the boundary area on the other contact surface, the deformation restriction effect will drop.

This construction will be explained in further detail.

Figure 2:
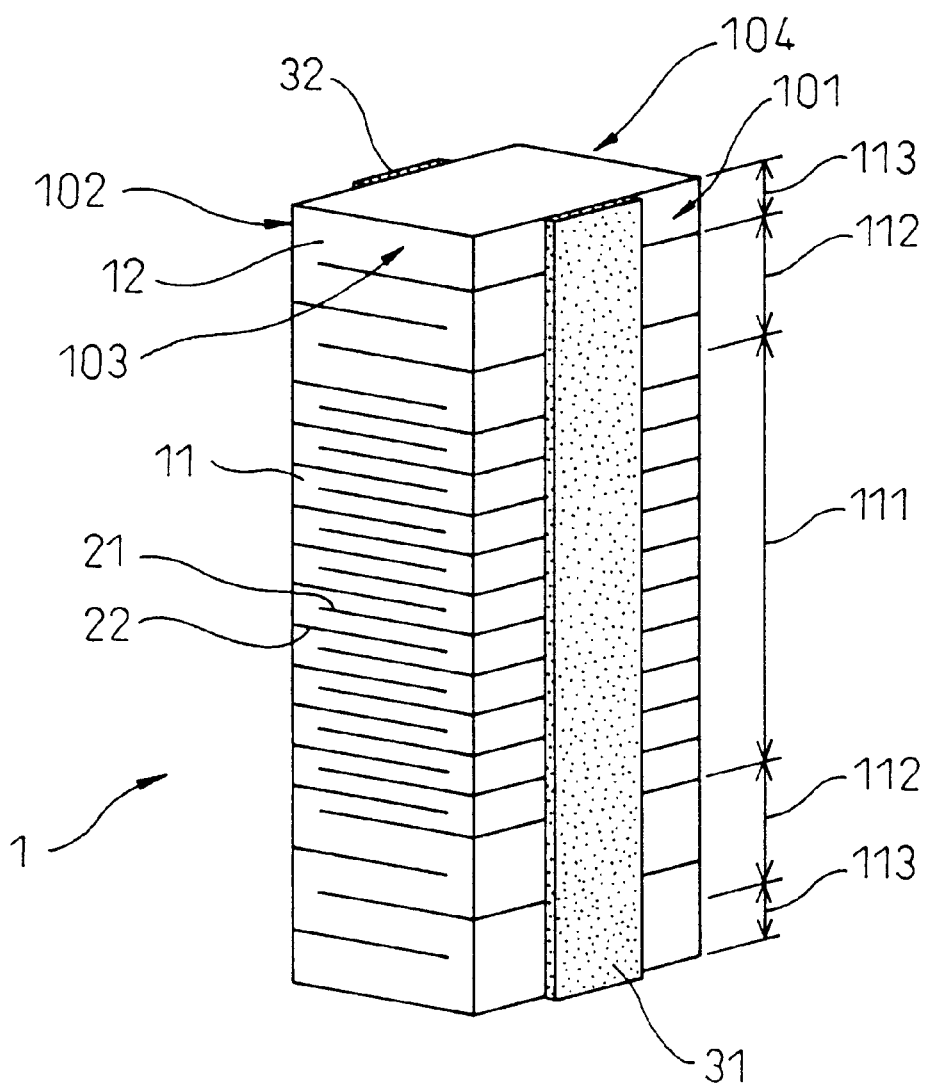
FIG. 2 is a perspective view of the piezoelectric device (stacked-body) according to the first embodiment.

As shown in FIGS. 1 to 3, the piezoelectric device 1 is assembled by alternately stacking internal electrode layers 21 and 22 to make positive and negative poles between piezoelectric layers 11. As shown in these drawings, one of the internal electrode layers 21 is so arranged as to be exposed to one 101 of the side surfaces, and the other internal electrode layer 22 is so arranged as to be exposed to the other side surface 102. Side surface electrodes 31 and 32 made of cured silver are so formed as to electrically connect the end portions of these exposed internal electrode layers 21 and 22, respectively.

As will be described later, cured silver constituting the side surface electrodes 31 and 32 is formed by curing an Ag paste, and has a composition consisting of Ag and a glass frit component.

Figure 4:
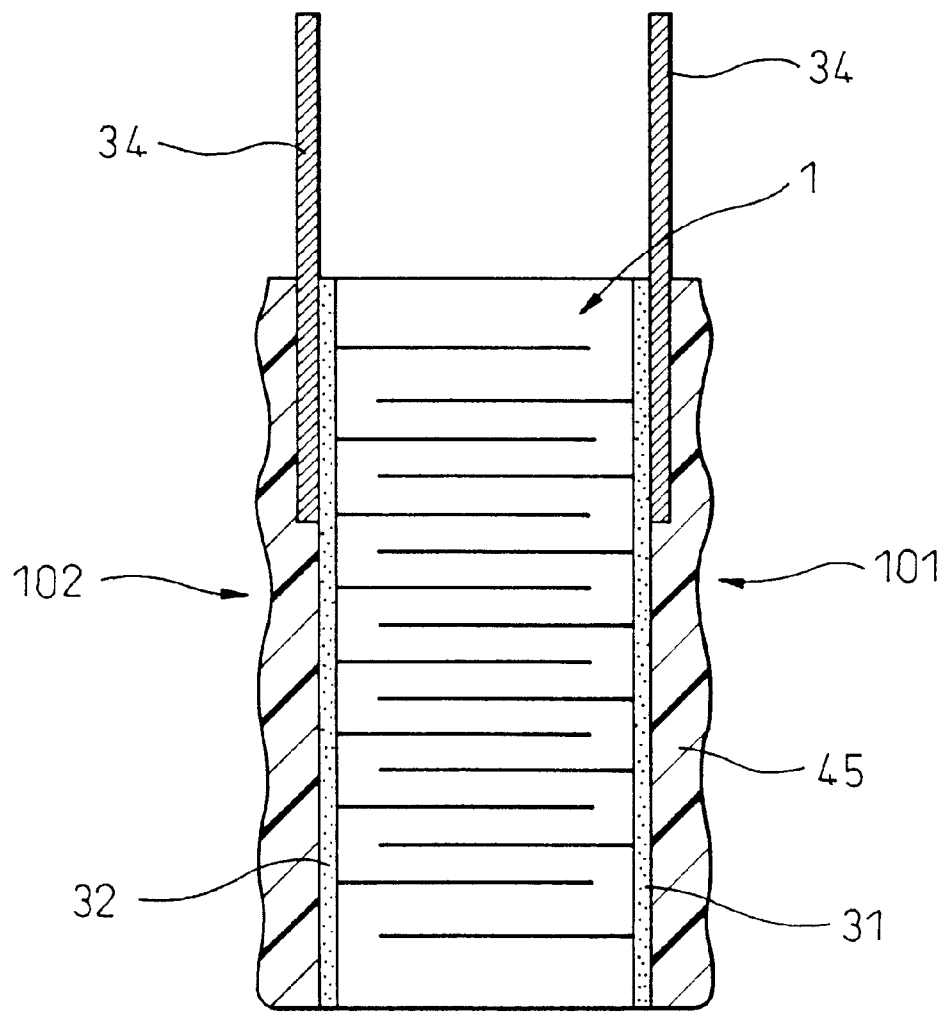
FIG. 4 is an explanatory view showing a condition where an insulating member is disposed on the outer peripheral side surfaces of the piezoelectric device in the first embodiment.

The external electrode 34 is bonded to each side surface electrode 31, 32 as shown in FIGS. 1 and 4.

The external electrode 34 in this embodiment uses an 18-8 stainless steel that is ordinarily employed.

In the piezoelectric device 1, its center portion in the stacking direction is used as a driving portion 11, portions sandwiching the center portion are used as buffer portions 112, and portions further sandwiching the buffer portions 112 are used as dummy portions 113, as shown in FIG. 2.

Next, a production method of this piezoelectric device 1 and its detailed construction will be explained.

The piezoelectric device 1 of this embodiment can be produced by use of a green sheet method that has been generally employed. To prepare the green sheet, powder of lead oxide, zirconium oxide, titanium oxide, niobium oxide, strontium carbonate, or the like, as the major raw material of the piezoelectric material is weighed into a desired composition in accordance with a known method. The mixture composition is prepared into a composition more lead-rich than a stoichiometric ratio in consideration of the evaporation of the lead. The composition is then dry mixed by use of a mixer and is thereafter calcined at 800 to 950° C.

Next, pure water and a dispersant are added to this calcined powder to form a slurry, and the slurry is wet pulverized by use of a pearl mill. After the pulverizate is dried and degreased, a solvent, a binder, a plasticizer, a dispersant, etc, are added, and a ball mill is used to mix the slurry. Thereafter, the resulting slurry is vacuum defoamed and its viscosity is adjusted while the slurry is being stirred by use of a stirrer inside a vacuum apparatus.

Next, the slurry is shaped into a green sheet, having a predetermined thickness, through a doctor blade.

After recovery, the green sheet is punched by using a press, or is cut by using a cutter, into a rectangular member having a predetermined size. The green sheet is common to each of the driving portion, the buffer portion and the dummy portion.

Figure 3A:
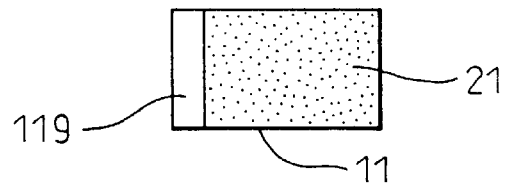
FIGS. 3A and 3B are plan views of one piezoelectric layer and one internal electrode layer in the first embodiment.
Figure 3B:
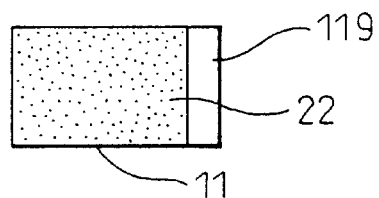

Next, a pattern is screen-printed on one of the surfaces of the green sheet so obtained by using a paste of silver and palladium (hereinafter called the "Ag/Pd paste") having a ratio of silver/palladium=7/3, for example. FIGS. 3A and 3B show an example of the green sheet after the pattern is printed. Incidentally, the same reference numerals are assigned to represent those portions which are substantially the same, for the sake of explanation.

A pattern 21(22) having a size a little smaller than the surface of the green sheet 11 as the piezoelectric layer is formed from the Ag/Pd paste on the surface of the green sheet 11, and is used as an internal electrode layer 21(22). A non-formation portion 119 of the internal electrode layer 21(22) is provided on the opposite side on the surface of the green sheet 11. In other words, the internal electrode layer 21(22) does not reach one of the end portions (the portion corresponding to the side surface 101 or 102 of the piezoelectric device 1) of the opposite sides of the green sheet 11, but does reach the other opposite end portion. Additionally, copper, nickel, platinum, silver or their mixture can be used besides the materials illustrated in this embodiment as the material of the internal electrode.

A predetermined number of such green sheets 11 having the internal electrode layer 21(22) are prepared on the basis of the specification required for the displacement amount of the driving portion 111. A predetermined number of green sheets 12 not having the internal electrode layer printed thereon, for the buffer portion 112 and the dummy portion 113, are also prepared.

Figure 3C:
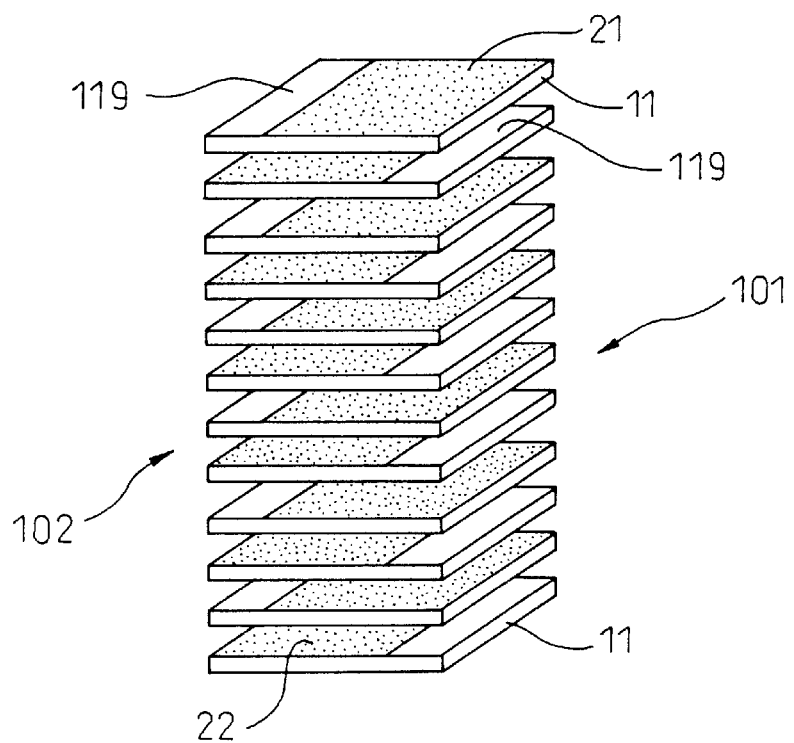
FIG. 3C is an exploded perspective view showing a stacked-state of the piezoelectric layer and the internal electrode layer.

Next, these green sheets 11 and 12 are stacked. FIG. 3C shows the stacked condition of the green sheets 11 and 12 and is substantially an exploded view of the piezoelectric device 1. Incidentally, this drawing mainly shows the portion corresponding to the driving portion.

When the green sheets 11 having the internal electrode layer 21(22) formed thereon are stacked, they are stacked in such a fashion that the non-formation portions 119 of the electrode are alternately positioned on the right and left in the drawing. Consequently, the internal electrode layers 21, reaching the side surface 101 on the right side of the green sheet 11 in the drawing and being exposed, serve as the internal electrode of one of the polarities, and the internal electrode layers 22, reaching the side surface 102 on the left side of the drawing and being exposed, serve as the internal electrode of the other polarity.

As shown in FIG. 3, only the green sheets 11 having the internal electrode layer 21(22) are stacked to form the driving portion 111 at the center. The green sheets 12 not having the internal electrode layers are sandwiched between the former green sheets to form the buffer portions 112. Further, only the green sheets 12 not having the internal electrode layer are stacked to form the dummy portions 113.

As a result, there can be obtained the stacked-body having the construction shown in FIGS. 1 and 2.

Figure 5:
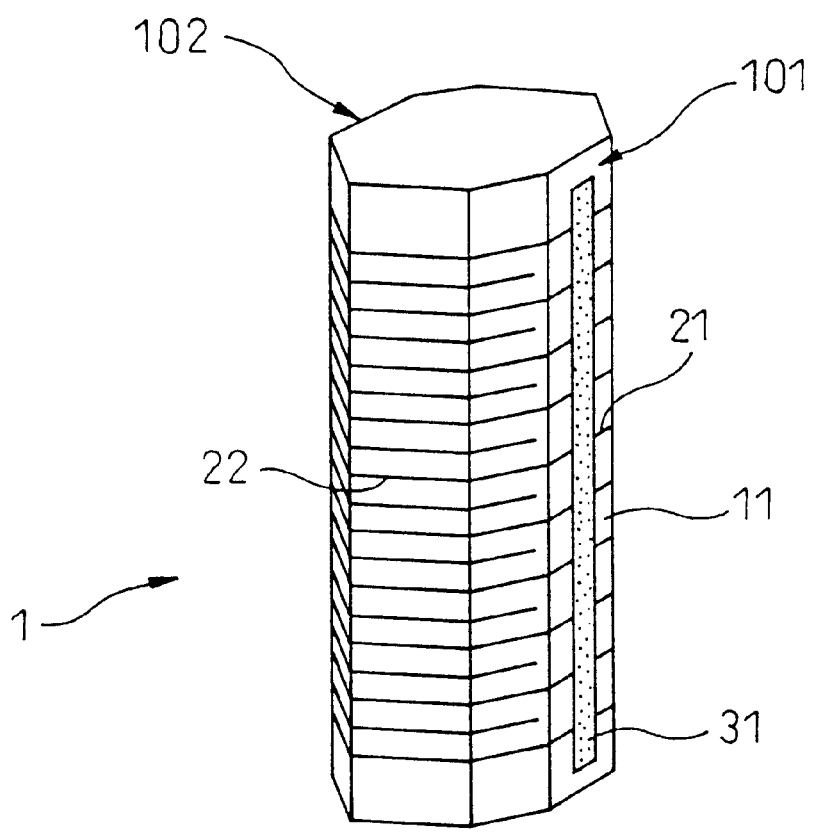
FIG. 5 is an explanatory view showing a piezoelectric device having an octagonal section in the first embodiment.

Incidentally, the stacked-body in this embodiment has a square sectional shape, but the sectional shape may well be a polygon inclusive of the square, a circle, a barrel shape, and so forth. For example, the stacked-body may have an octagonal sectional shape as shown in FIG. 5.

Next, heat-pressing is conducted by use of a hot-water rubber pressing, or the like, and degreasing is then conducted inside an electric furnace at 400 to 700° C., followed by baking at 900 to 1,200° C. A process step for shaping the outer shape, such as cutting, polishing, etc, may be thereafter added, whenever necessary.

Next, the Ag paste described above is applied to, and cured on, the side surfaces of the stacked-body to form the side electrodes 31 and 32. Though the side electrode is formed of cured silver in this embodiment, the Ag/Pd paste, for example, may be used.

Besides these pastes, it is also possible to use copper, nickel, platinum, silver/palladium, gold, and the like.

Besides the curing method described above, vacuum evaporation, sputtering, plating, and the like, may be employed to form the side electrode.

The side surface electrode 31 on the right side in FIG. 1 is formed at the position at which the internal electrode layers 21 of one of the polarities is exposed, and each internal electrode layer 21 is electrically connected. The other side surface electrode 32 on the left side in the drawing is formed at the position at which the internal electrode layers 22 of the other polarity are exposed, and each internal electrode layer 22 is likewise connected electrically. Thereafter, the external electrode 34 is bonded to each side surface electrode 31, 32.

The dummy portion 113 uses the green sheet (piezoelectric layer) 12 of the same material as that of the piezoelectric layer 11 used for the driving portion 111 as described above so as to restrict an increase in the kinds of the production materials and to reduce the production cost.

As shown in FIG. 4, the insulating member 45 is arranged on the entire side surface inclusive of the side surfaces 101 and 102 that are substantially parallel to the extension/contraction direction of the piezoelectric device 1. A powder coating of an epoxy resin is employed to form the insulating member 45. More concretely, a conductive adhesive is applied to the surface of each side surface electrode 31, 32 of the piezoelectric device 1 in such a fashion as to cover the side surface electrodes as a whole and after the external electrodes 34 are bonded, the insulating member 45 is formed. It is possible to use a polyimide resin, a silicone resin, a polyurethane resin, or the like, for the insulating member 45 in place of the epoxy resin. Besides the powder coating method described above, it is also possible to use dipping, spraying, potting, coating with a brush or spatula, and so forth. Further, molding by use of a mold can also be used.

Besides the bonding method of the external electrodes used in this embodiment, it is also possible to employ soldering, brazing, and so forth. Furthermore, the external electrode may be connected to the internal electrode through an electrically conductive adhesive without forming the side surface electrode. Besides the material illustrated in this embodiment, the material for the external electrode may be a metal foil or a metal wire (coated wire) each having conductivity. The shape of the external electrode material preferably has extensibility as represented by a corrugated sheet, a corrugated wire, a mesh, a punched metal, a metal lath wire netting (expanded metal), but these examples are in no way restrictive.

In this embodiment, the external electrode 34 is bonded to a part of the side surface electrode. However, it may be bonded to the full length of the side surface electrode. The external electrode 34 may be formed by bonding a portion that is extended outside the case for establishing electric conduction and a portion to be bonded to the side surface electrode of the piezoelectric device through means such as welding, soldering, brazing or caulking.

In this embodiment, the target thickness of the insulating member 45 is set to 0.1 mm, and the thickness falls within the range of 0.03 to 0.5 mm at least throughout the entire portions. In consequence, the occurrence of voids, etc, inside the insulating member 45 can be restricted and a sufficient electrical insulating effect can be expected.

The thickness of the insulating member is preferably within the range of 0.03 to 0.5 mm. When the thickness of the insulating member is less than 0.03 mm, the influences of the voids, etc, occurring inside the insulating member become so great that the electrical insulating effect is likely to drop. When the thickness exceeds 0.5 mm, heat conductivity is likely to drop.

The electric resistivity of the resulting insulating member 45 is $10^{12}$ ($\Omega \cdot m$).

In this case, the insulating member preferably has the electric resistivity of at least $10^{10}$ ($\Omega \cdot m$). When the electric resistivity is less than $10^{10}$ ($\Omega \cdot m$), the electrical insulation effect of the insulating member cannot be exhibited sufficiently.

The insulating member can be a resin/rubber type material. In this case, it is known that mixing of conductive metal powder is effective to increase thermal conductivity. However, when the electric resistivity excessively lowers due to mixing of metal powder, electric insulation performance of the insulating member cannot be secured. In this case, too, mixing of metal powder can improve thermal conductivity if the electric resistivity is within the range described above. Ceramic powder, or the like, that has an insulation property and high thermal conductivity, may be mixed.

Next, the piezoelectric device 1 is inserted into the case 41 made of the stainless steel as shown in FIG. 1. The insulating member 45 described above is brought into contact with the inner surface 410 of the case 41.

An upper plate 37 and a lower plate 38 are arranged in such a fashion that they come into contact with both end faces of the piezoelectric device 1 in the extension/contraction direction, respectively. The upper plate 37 is fixed to the case 41 but the lower plate 38 is capable of sliding with the case 41.

The function and effect of this embodiment is as follows.

In the piezoelectric device according to this embodiment, the insulating member 45 is bonded to the entire side surface of the piezoelectric device 1 inclusive of its side surfaces 101 and 102. Therefore, heat generated inside the piezoelectric device directly transfers to the insulating member 45 without passing through an air layer.

The insulating member 45 remains in the contact state with the metal case 41. Therefore, the heat transferred to the insulating member 45 is directly transferred to the case 41 without passing through an air layer.

Here, the case 41 is made of the metal, that is, the stainless steel, and high heat radiation by utilizing the high heat transferability can be accomplished efficiently. In consequence, heat transfer from the piezoelectric device to the insulating member 45 can be promoted and a temperature rise of the piezoelectric device 1 can be restricted.

The following experiment has been carried out in this embodiment to quantitatively clarify the effect described above.

A comparative piezoelectric device, in which the case 41 and the insulating member 45 are out of mutual contact, is prepared besides the piezoelectric device of this embodiment in which the case 41 and the insulating member 45 keep contact with each other. Both piezoelectric devices are driven at an impressed voltage of 150 V and 100 Hz at room temperature and 30 minutes later, the surface temperature of each stacked-body is measured by use of a thermocouple. As a result, when the case and the insulating member keep mutual contact as in this embodiment, the arrival temperature rises to 95° C., whereas the arrival temperature rises to 110° C. in the comparative example where the case and the insulating member are out of mutual contact.

It can be understood from the experimental result given above that the heat radiation effect is high when the case 41 and the insulating member 45 are in contact with each other as in the piezoelectric device 1 according to the present embodiment.

As described above, the piezoelectric device 1 of this embodiment has small energy consumption due to the restriction of the rise of its internal temperature, and can be applied to the injector.

Second Embodiment

Figure 6:
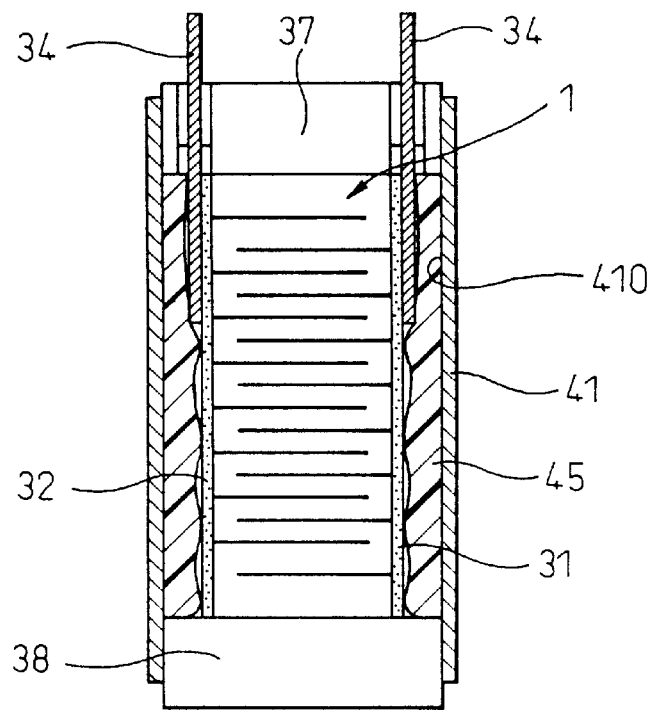
FIG. 6 is an explanatory sectional view showing a construction of a piezoelectric device according to a second embodiment of the present invention.

This embodiment represents the example where the arrangement of the insulating member 45 in the first embodiment is modified as shown in FIG. 6.

Figure 7:
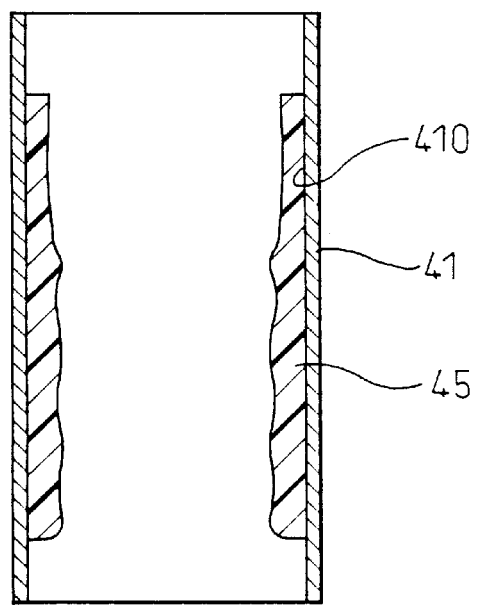
FIG. 7 is an explanatory view showing a condition where an insulating member is disposed on an inner surface of a case in the second embodiment.
Figure 8:
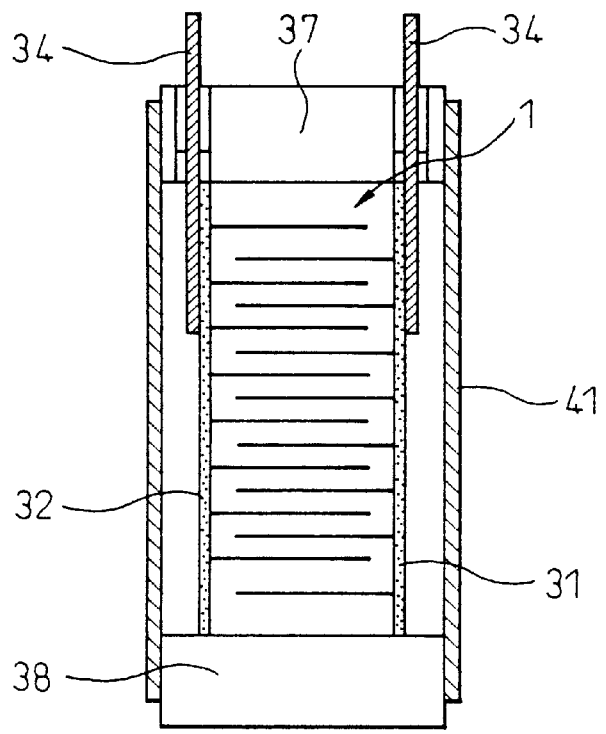
FIG. 8 is an explanatory sectional view showing a construction of a piezoelectric device according to a third embodiment of the present invention.

Namely, the insulating member 45 is bonded to the inner surface 410 of the case 41 as shown in FIG. 7. The piezoelectric device 1 is then inserted into the case 41 as shown in FIG. 6. The upper plate 37 and the lower plate 38 are arranged on both end faces of the piezoelectric device 1 in its extension/contraction direction. The rest of the construction is the same as that of the first embodiment.

In this second embodiment, the insulating member 45 is bonded to the inner surface 410 of the case 41 and at least part is in contact with the side surfaces of the piezoelectric device 1. It is preferred in this instance, too, that the insulating member 45 and the case 41 keep contact by at least 90% of their boundary area where the insulating member 45 and the case 41 are bonded, and keep contact by not greater than 30% of the boundary area on the surface where the insulating member 45 and the piezoelectric device 1 keep contact with each other.

The same function and effect as that of the first embodiment can be acquired in this second embodiment, too.

It is preferred in this second embodiment that the internal electrode layers having different polarities are not exposed to the same surface (side surface) in the stacked-body of the piezoelectric device.

Third Embodiment

This embodiment represents another example of the stacked-type piezoelectric device 1 built in the injector.

The side surface electrodes 31 and 32 are disposed on the side surfaces of this piezoelectric device 1. Each side surface electrode 31, 32 is provided with the external electrode 34 for establishing electric conduction with outside. In this embodiment, the thermal conductivity of the external electrode 34 is at least 15 W/m·K.

Unlike the first embodiment, the insulating member 45 is not disposed. The rest of the construction is the same as that of the first embodiment.

The external electrode 34 uses an 18-8 stainless steel. Therefore, the thermal conductivity of the electrode 34 is 15 W/m·K.

Accordingly, the external electrode 34 plays not only a role as the power supply member but also a role as the heat radiation member.

Therefore, the piezoelectric device 1 according to this embodiment can efficiently radiate the heat generated therein through the external electrode 34, and can restrict the excessive rise of the internal temperature.

In this embodiment, the insulating member is not interposed between the side surfaces of the piezoelectric device 1 and the case 41, but can further improve the heat radiation effect when the insulating member 45 is disposed in the same way as in the first embodiment.

Fourth Embodiment

Figure 9:
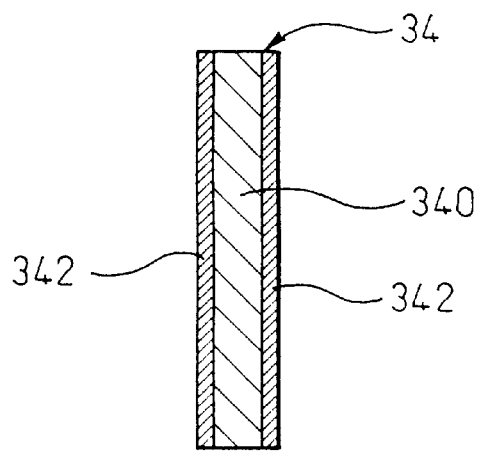
FIG. 9 is an explanatory view showing a construction of an external electrode according to a fourth embodiment of the present invention.

This embodiment represents the example where the construction of the external electrode 34 of the third embodiment is modified as shown in FIG. 9.

In other words, the external electrode 34 of this embodiment comprises a core material 340 and a coating material 342 that coats the surface of the core material 340. The coating material 342 is silver plating having a heat conductivity of at least 100 W/m·K (concretely, 420 W/m·K). Copper or gold plating can be employed in place of this silver plating.

The rest of the construction is the same as that of the third embodiment.

In this embodiment, the thermal conductivity of the external electrode 34 can be drastically improved as a whole due to the existence of the coating material 342. Consequently, the heat radiation effect can be improved through the external electrode 34, and the excessive rise of the internal temperature can be further restricted.

This embodiment can provide the same function and effect as that of the third embodiment.

Fifth Embodiment

Figure 10:
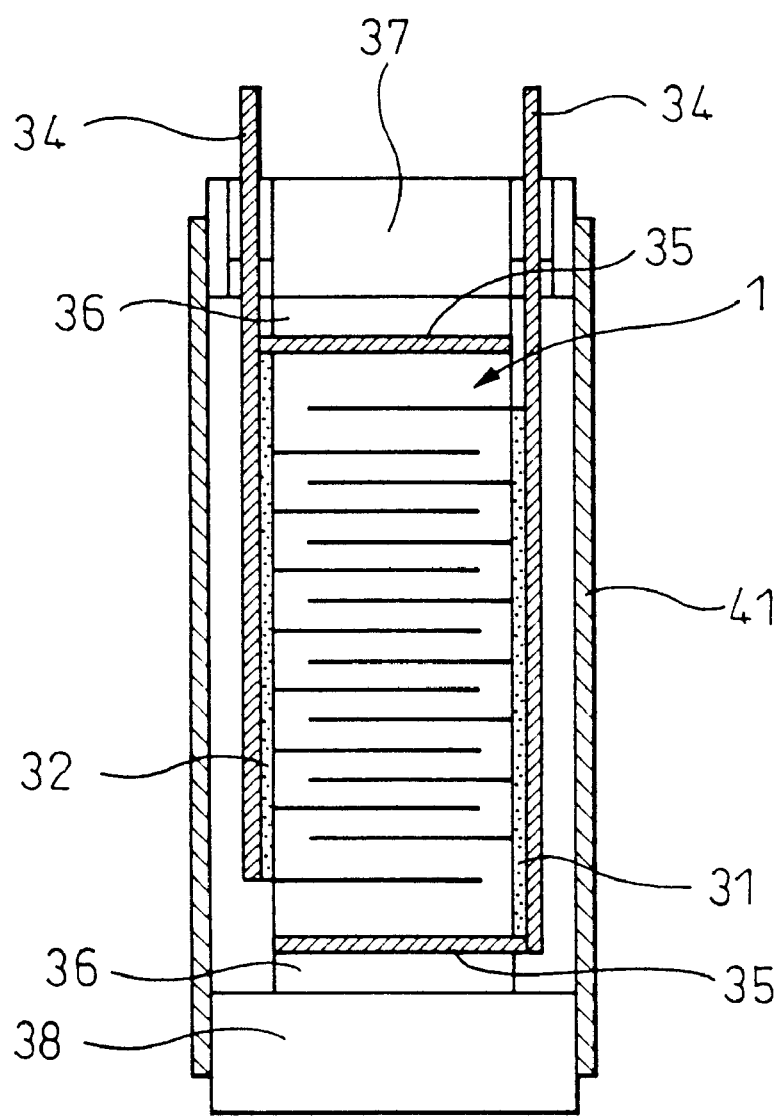
FIG. 10 is an explanatory sectional view showing a construction of a piezoelectric device according to a fifth embodiment of the present invention.

This embodiment represents the example where electrode plates 35 having a thermal conductivity of at least 15 W/m·K and keeping contact with the external electrode 34 are disposed on both end faces of the piezoelectric device 1 in the extension/contraction direction as shown in FIG. 10.

After the stacked-body is formed in the same way as in the first embodiment, the electrode plates 35 made of the 18-8 stainless steel and having a thermal conductivity of 15 W/m·K are disposed on both end faces of the stacked-body in the extension/contraction direction (lamination direction), respectively. More concretely, the electrode plates 35 are disposed by the steps of bonding the electrode plates 35 having substantially the same shape as that of both end faces of the piezoelectric device 1 to the external electrodes 34 by welding, and bonding the external electrodes 34 to the side surface electrodes 31 and 32 of the piezoelectric device 1 by use of an electrically conductive adhesive, respectively.

Next, ceramic insulating plates 36 are disposed on both electrode plates 35, respectively. The rest of the constructions are the same as those of the fourth embodiment.

In this case, the electrode plates 35 collect the heat from both end faces of the piezoelectric device 1 in its extension/contraction direction and can radiate this heat to the outside through the external electrode 35.

This construction can provide the same function and effect as that of the fourth embodiment.

Sixth Embodiment

This embodiment represents an example of an injector 5 using a piezoelectric device having basically the same construction as that of the piezoelectric device 1 of the first embodiment.

Figure 12:
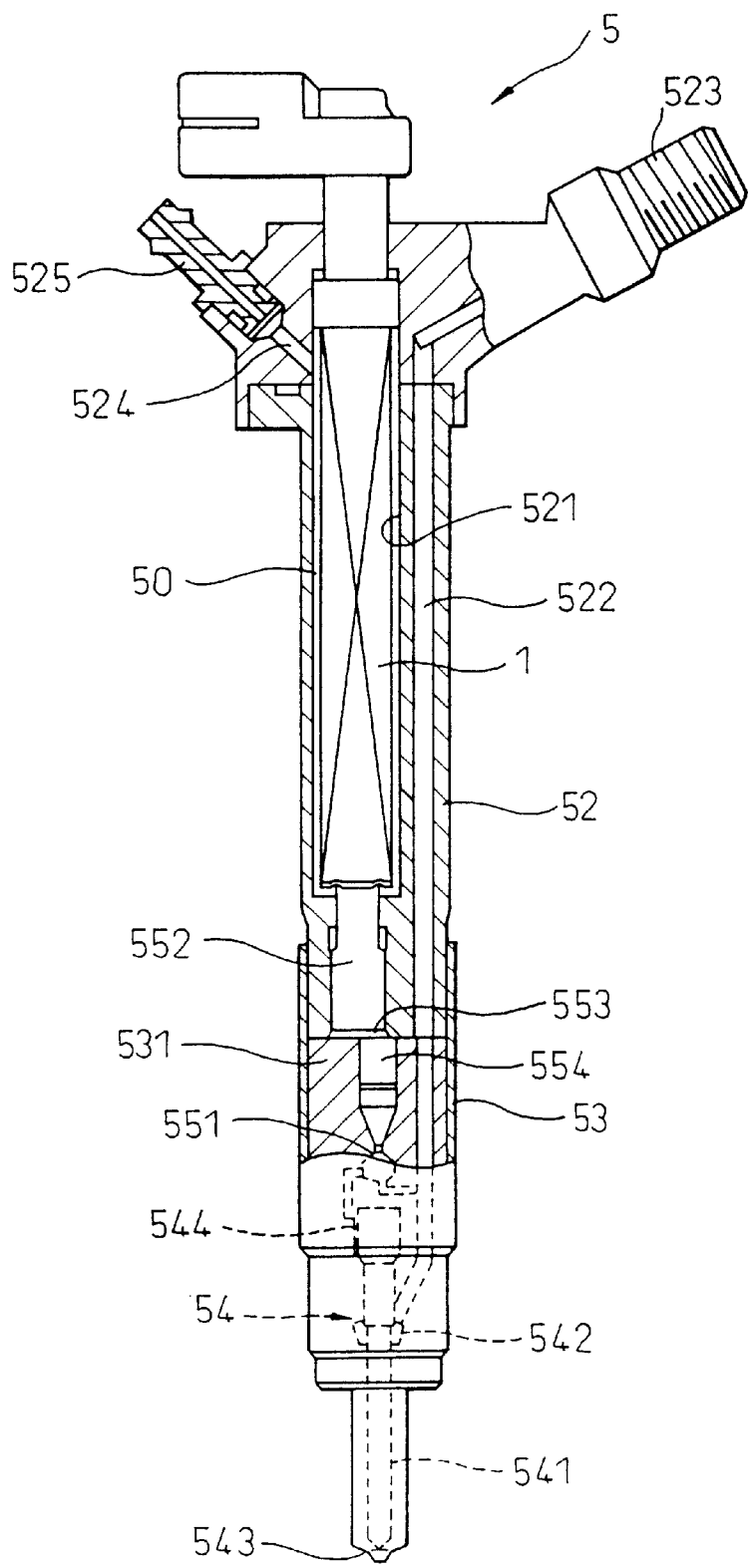
FIG. 12 is an explanatory view showing a construction of an injector according to the sixth embodiment of the present invention.

As shown in FIG. 12, the injector 5 of this embodiment is applied to a common rail injection system of a Diesel engine.

The injector 5 includes an upper housing 52 for accommodating the piezoelectric device 1 as the driving portion and a lower housing 53, fixed to the lower end of the upper housing 52, for forming therein an injection nozzle portion 54, as shown in the drawing.

The upper housing 52 is substantially circularly cylindrical, and the piezoelectric device is inserted and fixed into a longitudinal hole 521 that is eccentric to the center axis.

A high-pressure fuel passage 522 is so disposed on the side of the longitudinal hole 521 as to extend in parallel with this hole 521, and its upper end is communicated with the external common rail (not shown) through a fuel conduit 523 protruding to the upper part of the upper housing 52.

Another fuel conduit 525 communicating with a drain passage 524 protrudes from the upper part of the upper housing 52, and the fuel flowing from the fuel conduit 525 is returned to a fuel tank (not shown).

The drain passage 524 is communicated with a later-appearing three-way valve 551 by a passage, not shown, that extends through a space 50 between the longitudinal hole 521 and the driving portion (piezoelectric device) 1, and further extends downward from this space 50 through the upper and lower housings 52 and 53.

An injection nozzle portion 54 includes a nozzle needle 541 sliding up and down inside a piston body 531 and an injection hole 543 opened and closed by the nozzle needle body 541, for injecting the high-pressure fuel supplied from a fuel reservoir 542 into a cylinder of an engine. The fuel reservoir 542 is disposed at and around an intermediate portion of the nozzle needle 541, and the lower end of the high-pressure passage 522 opens here. The nozzle needle 541 receives the fuel pressure from the fuel reservoir 542 in a valve-opening direction and the fuel pressure from a back pressure chamber 544 so disposed as to face the upper end face in a valve-closing direction. The nozzle needle 541 is lifted when the pressure of the backpressure chamber 544 drops to open the injection hole 543 and to release the fuel.

The three-way valve 551 increases or decreases the pressure of the backpressure chamber 544. The three-way valve 551 is selectively communicated with the backpressure chamber 544 and the high-pressure fuel passage 522 or with the drain passage 524. The three-way valve 551 has a ball-like valve body for opening and closing a port communicating with the high-pressure fuel passage 522 or the drain passage 524. The driving portion drives this valve body through a large diameter piston 552, an oil pressure chamber 553 and a small diameter piston 554 disposed below the valve body.

Next, the lower part structure of the piezoelectric device in the first embodiment is modified to produce the driving portion 1 of this embodiment, that is, the piezoelectric device 1.

Figure 11:
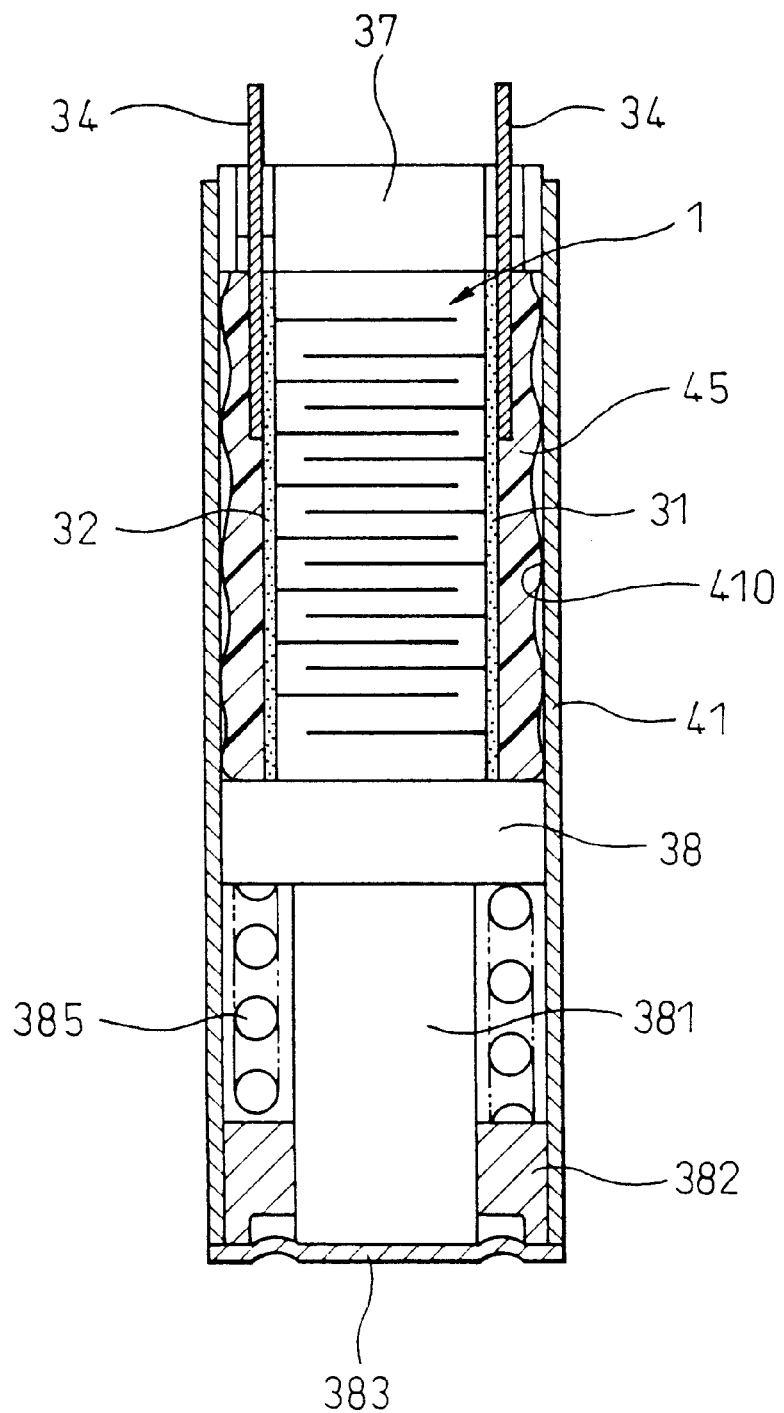
FIG. 11 is an explanatory sectional view showing a construction of a piezoelectric device according to a sixth embodiment of the present invention.

As shown in FIG. 11, a rod 381 is extended below the lower plate 38. A sheet member 382 is disposed in such a fashion as to penetrate through the rod 381, and a spring 385 is interposed between the sheet member 382 and the lower plate 38. A diaphragm 383 is disposed at the distal end of the case 41, and the distal end of the rod 381 is connected to the diaphragm 383.

Incidentally, the piezoelectric device 1 in this embodiment includes the insulating member 45 having the electric insulation property between the side surfaces of the piezoelectric device 1 and the inner surface 410 of the case 41 in the same way as in the first embodiment. The insulating member 45 is bonded to the side surfaces of the piezoelectric device 1 and keeps contact with the inner surface 410 of the case 41.

It is noteworthy that a space 50 exists around the piezoelectric device 1 under the state where the piezoelectric device 1 is disposed in the longitudinal hole 521 of the upper housing 52, and the fuel passes through this space 50. The fuel can come into direct contact with the metal case 41 of the piezoelectric device 1 and can easily conduct heat-exchange with the metal case 41. In other words, the fuel plays the role of a cooling fluid for cooling the piezoelectric device 1.

Therefore, the injector 5 of this embodiment can suppress the excessive temperature rise of the piezoelectric device 1 and can provide a high-speed response. Since exothermy is small, a control circuit can be made compact in size. In other words, the injector 5 of this embodiment is compact and has excellent performance.

As described above, the space 50 is secured around the piezoelectric device 1 and the fuel as the cooling fluid is caused to flow through this space 50 to cool the piezoelectric device 1 in this embodiment. However, it is also possible to employ a construction that uses cooling water or air as the cooling fluid instead of allowing the fuel to flow through the space 50.

The case 41 of the piezoelectric device 1 may well be brought into direct contact with the upper housing 52 without disposing the space 50. When the injector 5 is brought into contact with the engine block, heat-exchange between the engine block and the air can be utilized, and contact may be indirectly established with the air as the cooling fluid through the upper housing 5 and the engine block.

While the present invention has been described by reference to specific embodiments chosen for purposes of illustration, it should be apparent that numerous modifications could be made thereto by those skilled in the art without departing from the basic concept and scope of the invention.

What is claimed is:

1. A stacked-type piezoelectric device for an injector, to be built into the injector, including a metal case outside side surfaces of said piezoelectric device, wherein an insulating member having an electric insulation property is interposed between the side surfaces of said piezoelectric device and an inner surface of said case and one surface of the insulating member is bonded to either the side surfaces of said piezoelectric device or the inner surface of said case, and at least a part of the other surface of said insulating member is in contact with said side surfaces or said inner surface.

2. A piezoelectric device for an injector according to claim 1, wherein a thickness of said insulating member is within the range of 0.03 to 0.5 mm.

3. A piezoelectric device for an injector according to claim 1, wherein said insulating member is made of a material selected from the group consisting of an epoxy resin, a polyimide resin, a silicone resin and a polyurethane resin.

4. A piezoelectric device for an injector according to claim 1, wherein said insulating member is applied by use of dipping, powder coating, spraying, potting, or application by use of a brush or spatula, or is molded by use of a mold.

5. A stacked-type piezoelectric device for an injector, to be built in the injector, including side surface electrodes disposed on side surfaces of said piezoelectric device and external electrodes disposed on said side surface electrodes, for establishing electric conduction with the outside, wherein thermal conductivity of said external electrode is at least 15 W/m·K.

6. A piezoelectric device for an injector according to claim 5, wherein said piezoelectric device has, on at least one of the end faces thereof in an extension/contraction direction, an electrode plate keeping contact with said external electrode and having thermal conductivity of at least 15 W/m·K.

7. A piezoelectric device for an injector according to claim 5, wherein said external electrode comprises a core material and a coating material coating the surface of said coating material, and said coating material has thermal conductivity of at least 100 W/m·K.

8. A piezoelectric device for an injector according to claim 5, wherein said piezoelectric device has a metal case outside the side surfaces thereof, an insulating member having an electric insulation property is disposed between the surfaces of said piezoelectric device and an inner surface of said case, said insulating member is bonded to either one of the side surface of said piezoelectric device and the inner surface of said case, and at least a part of said insulating member is in contact with the other of said surfaces.

9. An injector having a built-in piezoelectric device as a driving source, wherein said piezoelectric device has a metal case outside the side surfaces thereof, an insulating member having an electric insulation property is disposed between the surfaces of said piezoelectric device and an inner surface of said case, said insulating member is bonded to either one of the side surfaces of said piezoelectric device and the inner surface of said case, at least a part of said insulating member is in contact with the other of said surfaces, and said case directly or indirectly comes into contact with a cooling fluid inside said injector.

10. An injector according to claim 9, wherein said cooling fluid is a fuel as an object of injection of said injector.

11. A method of producing a stacked-type piezoelectric device to be built in an injector, comprising the steps of:
   covering the outside of side surfaces of said piezoelectric device with an insulating member, and bonding said insulating member and the side surfaces of said piezoelectric device; and
   inserting said piezoelectric device covered with said insulating member into a metal case.

12. A method of producing a stacked-type piezoelectric device to be built in an injector, comprising the steps of:
   covering an inner surface of a metal case with an insulating member, and bonding said insulating member and the inner surface of said case; and
   inserting said piezoelectric device into said case covered with said insulating member.

13. A stacked-type piezoelectric device for an injector, to be built into the injector, including a metal case outside side surfaces of said piezoelectric device, wherein an insulating member having an electric resistivity of at least $10^{10}$ ($\Omega \cdot m$) is interposed between the side surfaces of said piezoelectric device and an inner surface of said case and one surface of the insulating member is bonded to either the side surfaces of said piezoelectric device or the inner surface of said case, and at least a part of the other surface of said insulating member is in contact with said side surfaces or said inner surface, wherein said insulating member and said piezoelectric device or said case is bonded over at least 90% of their boundary area on the surface where said insulating member and said piezoelectric device or said case are bonded, and keep contact by not greater than 30% of their boundary area on the other contact surface where said insulating member and said piezoelectric device or said case are in contact.

* * * * *